(12) United States Patent
Hoshino et al.

(10) Patent No.: US 10,996,852 B2
(45) Date of Patent: May 4, 2021

(54) TOUCH PANEL WITH ARROW KEYS ASSOCIATED WITH DIRECTION OF MOVEMENT OF A MOVING MECHANISM

(71) Applicant: DISCO CORPORATION, Tokyo (JP)

(72) Inventors: Suzu Hoshino, Tokyo (JP); Hayate Hoshino, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/715,561

(22) Filed: Dec. 16, 2019

(65) Prior Publication Data
US 2020/0201543 A1    Jun. 25, 2020

(30) Foreign Application Priority Data

Dec. 25, 2018 (JP) .............................. JP2018-241239

(51) Int. Cl.
| | |
|---|---|
| G06F 3/041 | (2006.01) |
| H01L 21/67 | (2006.01) |
| G06F 3/0488 | (2013.01) |
| G06F 3/0484 | (2013.01) |
| H01L 21/304 | (2006.01) |
| H01L 21/677 | (2006.01) |

(52) U.S. Cl.
CPC ...... G06F 3/04886 (2013.01); G06F 3/04847 (2013.01); *H01L 21/304* (2013.01); *H01L 21/67715* (2013.01)

(58) Field of Classification Search
CPC .......... G06F 3/041; G06F 3/045; G06F 3/042; G06F 3/044; G06F 3/043; G01R 27/26; H01L 21/67
See application file for complete search history.

(56) References Cited

U.S. PATENT DOCUMENTS

| | | | | |
|---|---|---|---|---|
| 5,309,380 | A * | 5/1994 | Satoh | G06F 15/0225 708/137 |
| 6,640,423 | B1 * | 11/2003 | Johnson | H01L 21/67144 29/721 |
| 2003/0216834 | A1 * | 11/2003 | Allard | G05D 1/0038 700/245 |
| 2008/0270949 | A1 * | 10/2008 | Liang | G06F 3/0482 715/859 |
| 2011/0288696 | A1 * | 11/2011 | Lefebure | A63H 30/04 701/2 |
| 2012/0171927 | A1 * | 7/2012 | Yu | A63H 30/04 446/484 |
| 2018/0326299 | A1 * | 11/2018 | Muramatsu | A63F 13/22 |
| 2019/0272092 | A1 * | 9/2019 | Nakanishi | G06F 3/0412 |
| 2020/0194287 | A1 * | 6/2020 | Hirochi | H01L 21/67017 |

FOREIGN PATENT DOCUMENTS

| | | |
|---|---|---|
| JP | 2014232757 A | 12/2014 |
| JP | 2018117014 A | 7/2018 |

* cited by examiner

*Primary Examiner* — Pegeman Karimi
(74) *Attorney, Agent, or Firm* — Greer Burns & Crain, Ltd.

(57) ABSTRACT

With a touch panel, an operator sets a moving direction of a moving mechanism by using an arrow key. The set moving direction is displayed in a display portion on the touch panel as an arrow. This enables the operator to set the moving direction in association with a correction while visually recognizing the contents of the setting, so that the operator can set the moving direction with less hesitation. Therefore, it is possible to suppress erroneous setting of the moving direction and to shorten the time required for the setting of the correction.

19 Claims, 5 Drawing Sheets

FIG.3A

Transfer arm 2

Arm-related settings (AR)

| | | |
|---|---|---|
| Arm 2 Time period for waiting until receiving wafer | [1] | sec |
| Arm 2 Time period for waiting until passing wafer | [2] | sec |
| Arm 2 Correction for position with respect to chuck A | Z [3] | mm  θ [4]° |
| Arm 2 Correction for position with respect to chuck B | Z [3] | mm  θ [4]° |
| Arm 2 Multiplication ratio of TY speed | ORG [5] CT [6] | SP [7] |
| Arm 2 Cleaning water ON in receiving wafer | [8] | |

Pad cleaning settings (PR)

| | | |
|---|---|---|
| Cleaning time period | [10] | sec |
| Rotational speed of cleaning brush | [11] | rpm |
| Rotational direction of cleaning brush | [12] | |
| Speed of Y-axis swing | [13] | mm/sec |
| Correction for Z-axis position of pad | [14] | mm |
| Cleaning interval of pad | [15] | pcs |

GP6700 SDF

Save (S)   Cancel (C)

FIG.3B 185 (41)

| Esc | AC | BS | / |
|---|---|---|---|
| 7 | 8 | 9 | * |
| 4 | 5 | 6 | − |
| 1 | 2 | 3 | + |
| ⇅ | 0 | | = |

(43, 45, 47)

TOUCH PANEL WITH ARROW KEYS ASSOCIATED WITH DIRECTION OF MOVEMENT OF A MOVING MECHANISM

BACKGROUND OF THE INVENTION

Field of the Invention

The present invention relates to a touch panel.

Description of the Related Art

For example, in a fully automatic grinding apparatus, a wafer accommodated in a cassette is taken out by a robot from the cassette to be transferred to a chuck table. The wafer is held on the chuck table, ground by grinding stones, and then transferred to a spin cleaning unit by an unloading mechanism. The spin cleaning unit rotates at high speed with the wafer held thereon, thereby cleaning the wafer. The wafer thus cleaned is housed into another cassette by the robot (refer to Japanese Patent Laid-open No. 2018-117014 and Japanese Patent Laid-open No. 2014-232757, for example).

In this manner, in a fully automatic grinding apparatus, a wafer is transferred by a robot taking out the wafer from a cassette and placing the wafer into another cassette and by an unloading mechanism unloading the wafer from a chuck table to a spin cleaning unit.

SUMMARY OF THE INVENTION

The unloading mechanism attracts the wafer with a transfer pad thereof to unload the wafer from the chuck table. Air is then blown against a lower surface of the wafer being unloaded, so that water droplets are removed from the lower surface of the wafer. Further, the lower surface of the wafer held by the transfer pad is cleaned by a cleaning brush. At the time of removing water droplets or cleaning the lower surface of the wafer, the transfer pad is stopped at a height position determined in advance.

If an actual height position of the transfer pad is deviated from the predetermined height position, however, it is difficult to remove water droplets and clean the lower surface of the wafer in a favorable manner. In such a case, it is inefficient to stop the fully automatic operation of the grinding apparatus and readjust the height position of the transfer pad. Therefore, there is a need for setting the height position of the transfer pad to a predetermined height position by performing fine adjustment without stopping the fully automatic operation.

Accordingly, a technique has been proposed which moves the height position of the transfer pad by inputting a correction value through an inputting screen of the grinding apparatus. This enables the height position of the transfer pad to be moved in accordance with the input correction value, and it is thus possible to remove water droplets and clean the lower surface of the wafer in a favorable manner.

In this technique, for example, inputting a positive correction value represents moving the height position of the transfer pad upward whereas inputting a negative correction value represents moving the height position of the transfer pad downward.

However, it is carried out only occasionally to input a correction value to move the height position of the transfer pad. It may thus take time for an operator to decide whether he/she should input a positive value or a negative value as a correction value in a case, for example, where the operator wants to move the height position of the transfer pad upward. In this case, the operator takes the trouble to check a manual of the apparatus in order to find out whether a positive value or a negative value is to be input as a correction value. This checking takes time and lowers the work efficiency.

Therefore, it is an object of the present invention to enable the operator to input a correction value with less hesitation.

In accordance with an aspect of the present invention, there is provided a touch panel provided in a processing apparatus and receiving inputs of a moving direction and a movement amount of a moving mechanism positioned on a moving path between a first position and a second position, including a numeric keypad for inputting the movement amount, and an arrow key for setting the moving direction to one of a first direction toward the first position on the moving path and a second direction toward the second position on the moving path.

Preferably, the moving path includes a path extending vertically, a path extending forward and backward, a path extending leftward and rightward, and a turning path.

Preferably, a first arrow indicating the first direction on the moving path and a second arrow indicating the second direction on the moving path are displayed on the arrow key.

With the touch panel, the operator can set the moving direction by using the arrow key. This enables the operator to set the moving direction while visually recognizing the contents of the setting, so that the operator can set the moving direction with less hesitation. Therefore, it is possible to suppress erroneous setting of the moving direction and to shorten the time required for the setting.

In addition, examples of the moving path of the moving mechanism include the path extending vertically, the path extending forward and backward, the path extending leftward and rightward, and the turning path. Further, on the arrow key, the first arrow indicating the first direction on the moving path and the second arrow indicating the second direction on the moving path may be displayed. Accordingly, the operator can set the moving direction with further less hesitation.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 3A is a schematic view illustrating a display example of a touch panel;

FIG. 3B is a schematic view illustrating an example of a correction value inputting screen image;

DETAILED DESCRIPTION OF THE PREFERRED EMBODIMENT

Figure 1:
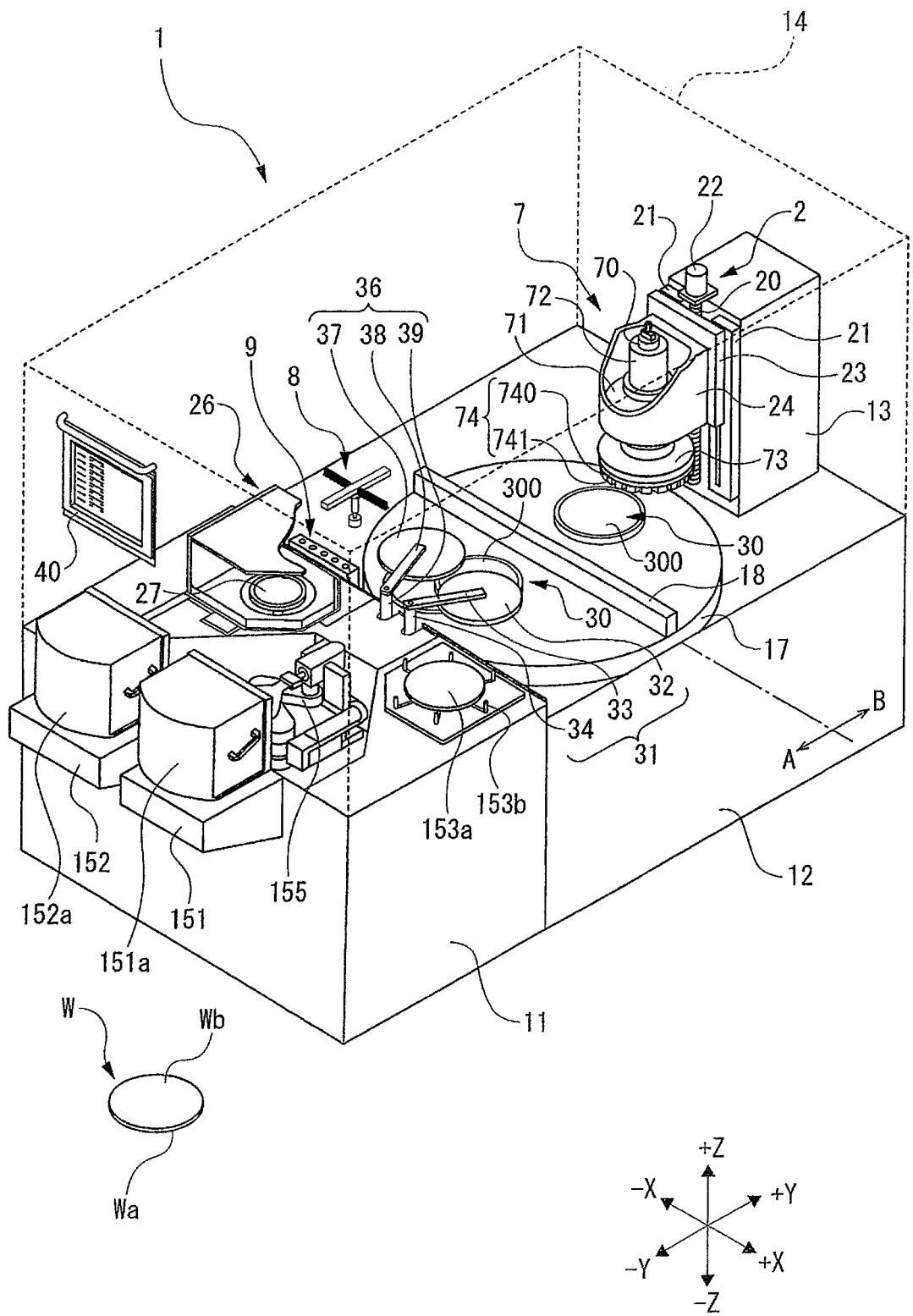
FIG. 1 is a perspective view illustrating a configuration example of a grinding apparatus.

As illustrated in FIG. 1, a grinding apparatus 1, as an example of a processing apparatus, is configured to fully automatically carry out a series of processes including loading, grinding, cleaning, and unloading of a wafer W that is an example of a workpiece.

The wafer W illustrated in FIG. 1 is, for example, a circular semiconductor wafer and has a front surface Wa and a back surface Wb, the front surface Wa facing downward in FIG. 1. A plurality of devices are formed on the front surface Wa of the wafer W and protected by a protective tape (not illustrated) attached to the front surface Wa. The back surface Wb of the wafer W is a surface to be processed in grinding.

The grinding apparatus 1 includes a first apparatus base 11 in a substantially rectangle shape, a second apparatus base 12 connected to a rear side (a +Y-axis direction side) of the first apparatus base 11, a column 13 extending upward, and a housing 14 covering the first apparatus base 11 and the second apparatus base 12.

The first apparatus base 11 has, on a front surface side (a −Y-axis direction side) thereof, a first cassette placing portion 151 and a second cassette placing portion 152. A first cassette 151a accommodating wafers W to be processed is placed on the first cassette placing portion 151. A second cassette 152a accommodating processed wafers W is placed on the second cassette placing portion 152. The first cassette 151a and the second cassette 152a each have a plurality of racks therein and have one wafer W accommodated in each rack.

The first cassette 151a has an opening (not illustrated) facing the +Y-axis direction side. A robot 155 is disposed on the +Y-axis direction side of the opening. The robot 155 loads a processed wafer W into the second cassette 152a. The robot 155 also unloads a wafer W to be processed from the first cassette 151a to place the wafer W in a temporary placing region 153a.

The temporary placing region 153a is disposed at a position adjacent to the robot 155. Positioning means 153b is disposed in the temporary placing region 153a. The positioning means 153b performs positioning (centering), at a predetermined position, of the wafer W unloaded from the first cassette 151a and placed in the temporary placing region 153a by using positioning pins that can be reduced in diameter.

A loading mechanism 31 is disposed at a position adjacent to the temporary placing region 153a. The loading mechanism 31 includes a first transfer pad 32, a first transfer arm 33 supporting the first transfer pad 32, and first elevating means 34 supporting the first transfer arm 33.

The first transfer pad 32 has a holding surface formed of a porous material or the like, and a suction source is connected with the holding surface (both not illustrated). The first transfer pad 32 holds under suction the wafer W that has been positioned by the positioning means 153b and is to be ground with a suction force generated by the suction source.

The first transfer arm 33 holds the first transfer pad 32 at a distal end thereof and is connected at the other end thereof with the first elevating means 34. The first transfer arm 33 turns about the first elevating means 34, thereby moving the first transfer pad 32 horizontally. The first elevating means 34 raises and lowers the first transfer pad 32 together with the first transfer arm 33 along Z-axis directions.

The loading mechanism 31 transfers the wafer W to a chuck table 30 positioned within a loading/unloading region A by using the first transfer pad 32, the first transfer arm 33, and the first elevating means 34.

The chuck table 30 is provided on a turntable 17 having a circular shape in plan view, the turntable 17 being disposed on the second apparatus base 12. The turntable 17 has a partition plate 18 separating the space on the turntable 17 into two sections, and two chuck tables 30 disposed one for each of the two sections partitioned by the partition plate 18.

The turntable 17 has at a center thereof a rotation axis (not illustrated) extending in the Z-axis directions such that the turntable 17 can rotate about the rotation axis. Along with the rotation of the turntable 17, the two chuck tables 30 revolve, so that each of the chuck tables 30 can move from the loading/unloading region A to a grinding region B, and vice versa.

The chuck table 30 can rotate about its axis extending in the Z-axis directions on the turntable 17. Further, the chuck table 30 has a holding surface 300 for attracting the wafer W thereon. The holding surface 300 is communicated with a suction source not illustrated, thereby holding the wafer W under suction.

The column 13 is vertically disposed in a rear portion (on the +Y-axis direction side) on the second apparatus base 12. The column 13 has on a front surface thereof grinding means 7 grinding the wafer W and grind-feeding means 2 moving the grinding means 7 in the Z-axis directions as grind-feeding directions.

The grind-feeding means 2 includes a pair of Z-axis guide rails 21 extending in parallel with the Z-axis directions, a Z-axis moving table 23 sliding on the Z-axis guide rails 21, a Z-axis ball screw 20 extending in parallel with the Z-axis guide rails 21, a Z-axis servomotor 22, and a holder 24 attached to a front surface of the Z-axis moving table 23. The holder 24 holds the grinding means 7.

The Z-axis moving table 23 is slidably disposed on the Z-axis guide rails 21. The Z-axis moving table 23 has a nut portion (not illustrated) fixed to a back surface side thereof, and the Z-axis ball screw 20 is screwed into the nut portion. The Z-axis servomotor 22 is connected with one end portion of the Z-axis ball screw 20.

In the grind-feeding means 2, the Z-axis servomotor 22 rotates the Z-axis ball screw 20 to cause the Z-axis moving table 23 to move along the Z-axis guide rails 21 in the Z-axis directions. Accordingly, the holder 24 attached to the Z-axis moving table 23 and the grinding means 7 held by the holder 24 also move in the Z-axis directions along with the Z-axis moving table 23.

The grinding means 7 includes a spindle housing 71 fixed to the holder 24, a spindle 70 rotatably held by the spindle housing 71, a wheel mount 73 attached to a lower end of the spindle 70, and a grinding wheel 74 supported by the wheel mount 73.

The spindle housing 71 is held by the holder 24 so as to extend in the Z-axis directions. The spindle 70 extends in the Z-axis directions so as to intersect perpendicularly with the holding surface 300 of the chuck table 30 and is rotatably supported by the spindle housing 71.

The spindle 70 has a rotational drive source (not illustrated) such as a motor connected to an upper end thereof. The rotational drive source drives the spindle 70 to rotate about its axis extending in the Z-axis directions.

The wheel mount 73 is formed in a disk shape and fixed to the lower end (distal end) of the spindle 70. The wheel mount 73 supports the grinding wheel 74. The grinding wheel 74 is formed to have a diameter substantially the same as that of the wheel mount 73. The grinding wheel 74 includes a ring-shaped wheel base (annular base) 740 formed of a metallic material such as stainless steel. The wheel base 740 has a plurality of grinding stones 741 annularly arranged all over the circumference of a lower surface thereof. The grinding stones 741 grind the wafer W held on the chuck table 30.

The wafer W after being ground is unloaded by an unloading mechanism 36. The unloading mechanism 36 is disposed at a position adjacent to the loading mechanism 31. The unloading mechanism 36 includes a second transfer pad 37, a second transfer arm 38 supporting the second transfer pad 37, and second elevating means 39 supporting the second transfer arm 38.

The second transfer pad 37 has a holding surface formed of a porous material or the like, and a suction source is connected with the holding surface (both not illustrated). The second transfer pad 37 holds under suction the ground wafer W placed on the chuck table 30 with a suction force generated by the suction source.

The second transfer arm 38 holds the second transfer pad 37 at a distal end thereof and is connected at the other end thereof with the second elevating means 39. The second transfer arm 38 turns about the second elevating means 39, thereby moving the second transfer pad 37 horizontally. The second elevating means 39 raises and lowers the second transfer pad 37 together with the second transfer arm 38 along the Z-axis directions.

The unloading mechanism 36 unloads the wafer W from the chuck table 30 and transfers the same to a spinner table 27 in a single-wafer spin cleaning unit 26 by using the second transfer pad 37, the second transfer arm 38, and the second elevating means 39.

The spin cleaning unit 26 is disposed in the proximity of the unloading mechanism 36. The spin cleaning unit 26 includes the spinner table 27 holding the wafer W thereon and various nozzles (not illustrated) ejecting a cleaning water and air for drying onto the spinner table 27.

In the spin cleaning unit 26, the spinner table 27 on which the wafer W is held is lowered into the first apparatus base 11 where the cleaning water is ejected onto the back surface Wb of the wafer W for spin-cleaning of the back surface Wb. Air is then blown against the wafer W to dry the wafer W. The wafer W thus cleaned by the spin cleaning unit 26 is loaded into the second cassette 152a by the robot 155.

A cleaning unit 8 is disposed in the proximity of the spin cleaning unit 26 on the second apparatus base 12. The cleaning unit 8 cleans the holding surface (the surface holding the wafer W) of the second transfer pad 37. More specifically, in the grinding apparatus 1, after the wafer W is transferred by the second transfer pad 37 from the chuck table 30 to the spin cleaning unit 26, the holding surface of the second transfer pad 37 is cleaned by the cleaning unit 8.

Figure 2:
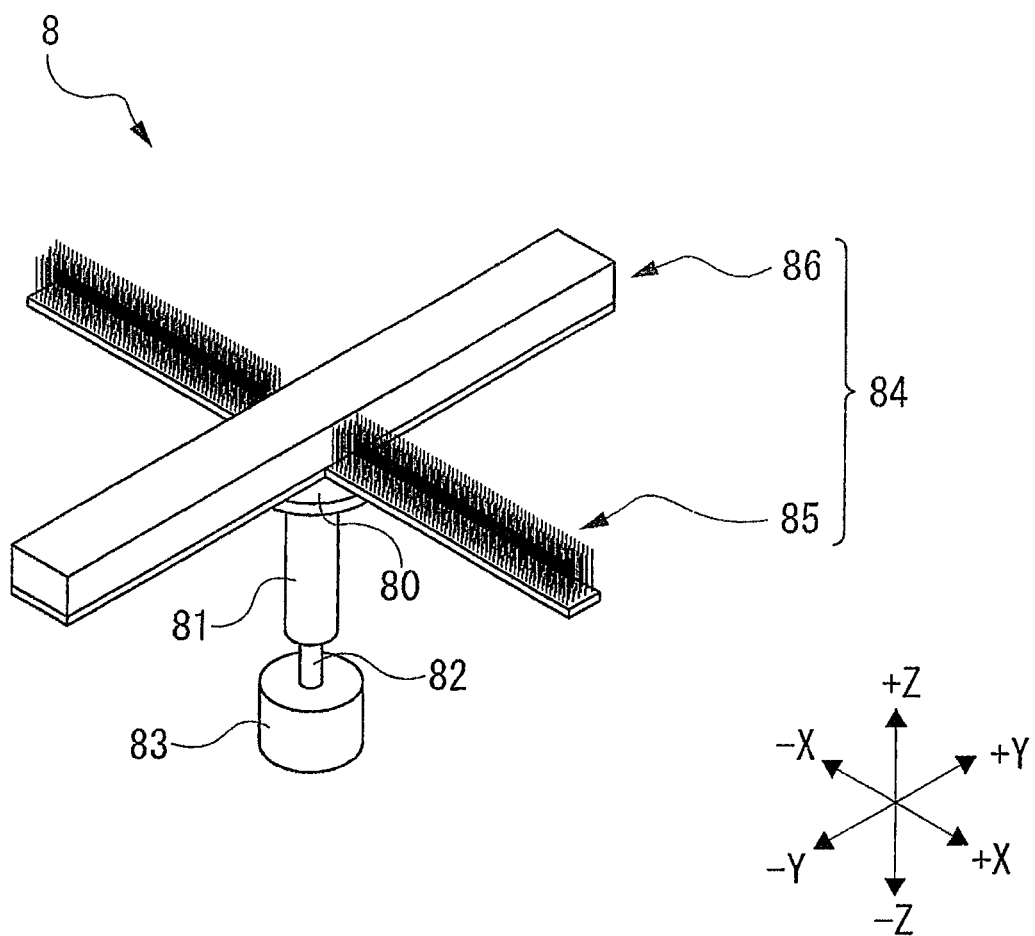
FIG. 2 is a perspective view illustrating a configuration example of a cleaning unit.

As illustrated in FIG. 2, the cleaning unit 8 includes a disk-shaped support plate 80, a rotary shaft 82 disposed on a bottom surface side of the support plate 80 with a rotary joint 81 interposed therebetween, a motor 83 for driving the rotary shaft 82 to rotate, and a cleaning brush section 84 disposed on the support plate 80.

The rotary shaft 82 extending in the Z-axis directions is connected at one end thereof to a center of the support plate 80 with the rotary joint 81 interposed therebetween and connected at the other end thereof to the motor 83. The rotary joint 81 rotatably supports the rotary shaft 82. The motor 83 drives the rotary shaft 82 to rotate, thereby rotating the support plate 80.

The cleaning brush section 84 includes two brushes 85 and a stone 86. The brushes 85 are used for brush cleaning. The brush cleaning is aimed at scraping out and removing grinding debris having entered the porous material forming the holding surface of the second transfer pad 37. The brush cleaning is further aimed at cleaning the lower surface (the front surface Wa) of the wafer W held on the holding surface of the second transfer pad 37. The brush cleaning is yet further aimed at cleaning a surface of the protective tape attached to the lower surface (the front surface Wa) of the wafer W. The brushes 85 are formed by, for example, forming fibers having elasticity or resin wires having elasticity into a straight-hair state and collecting them in a concentrated manner, with the bristle tips facing the +Z-axis direction. The two brushes 85 radially extend with the rotary shaft 82 as a center. Note that a cleaning water is supplied from a cleaning water supply source not illustrated to the cleaning brush section 84.

The stone 86 is used for stone cleaning. The stone cleaning is aimed at scraping and removing grinding debris adhered to the holding surface of the second transfer pad 37. The stone 86 is formed, for example, of a resin bond grindstone or a ceramic material formed into a rectangular parallelepiped. The stone 86 is disposed between the two brushes 85 on the support plate 80 so as to perpendicularly intersect the brushes 85.

In the cleaning unit 8, the cleaning brush section 84 including the stone 86 and the two brushes 85 rotates in a horizontal plane with the rotation of the support plate 80 by the rotary shaft 82 in a state in which the cleaning brush section 84 is in contact with the holding surface of the second transfer pad 37 of the unloading mechanism 36. In this case, the second transfer pad 37 is swung along the Y-axis directions by the second transfer arm 38.

Further, as illustrated in FIG. 1, a touch panel 40 is installed on a side surface of the housing 14. The touch panel 40 displays various kinds of information such as processing conditions regarding the grinding apparatus 1. The touch panel 40 is also used for inputting various kinds of information such as processing conditions. In this manner, the touch panel 40 functions as inputting means for inputting information and also as displaying means for displaying input information.

Following is an example of an operation in the unloading mechanism 36 from transferring the wafer W by the second transfer pad 37 from the chuck table 30 to the spinner table 27 until cleaning the holding surface of the second transfer pad 37.

(1) The second transfer arm 38 is caused to turn about the second elevating means 39, so that the second transfer pad 37 is positioned above the chuck table 30.

(2) The second elevating means 39 lowers the second transfer pad 37 to bring the holding surface of the second transfer pad 37 in contact with the back surface Wb of the wafer W held on the chuck table 30.

(3) The holding surface of the second transfer pad 37 is communicated with the suction source to hold the wafer W under suction.

(4) The holding surface of the chuck table 30 is communicated with an air source, so that the wafer W is separated from the holding surface of the chuck table 30.

(5) The second elevating means 39 raises the second transfer pad 37 on which the wafer W is held.

(6) The second transfer arm 38 is turned, so that the second transfer pad 37 on which the wafer W is held is horizontally moved from a position above the chuck table 30 to a position above the spinner table 27 of the spin cleaning unit 26.

(7) Before completion of the horizontal movement of the second transfer pad 37 to the position above the spinner table 27, the second transfer pad 37 is stopped above the cleaning unit 8, and the second elevating means 39 lowers the second transfer pad 37 such that the lower surface (the front surface Wa) of the wafer W held on the holding surface of the second transfer pad 37 comes in contact with the brushes 85. The brushes 85 are then rotated to clean the lower surface (the front surface Wa) of the wafer W.

After cleaning the lower surface (the front surface Wa) of the wafer W, the second elevating means 39 raises the second transfer pad 37, and the second transfer pad 37 is horizontally moved toward the position above the spinner table 27.

The lower surface (the front surface Wa) of the wafer W is blown with air ejected from air ejection ports of an air nozzle section 9 extending in a direction intersecting a transfer path of the second transfer pad 37 horizontally moving to the position above the spinner table 27, and water droplets left on the front surface Wa of the wafer W are thereby removed.

(8) The second elevating means 39 lowers the second transfer pad 37 on which the wafer W is held, so that the front surface Wa of the wafer W is brought into contact with the spinner table 27 of the spin cleaning unit 26.

(9) The spinner table 27 holds the wafer W. Thereafter, the holding surface of the second transfer pad 37 is communicated with an air source, so that the wafer W is separated from the holding surface of the second transfer pad 37.

(10) The second elevating means 39 raises the second transfer pad 37, and the second transfer arm 38 turns to move the second transfer pad 37 to the position above the cleaning unit 8.

(11) The second elevating means 39 lowers the second transfer pad 37 such that the holding surface of the second transfer pad 37 comes in contact with the cleaning brush section 84 (the stone 86 and the brushes 85) of the cleaning unit 8.

In the operation described above, when removing water droplets on the front surface Wa of the wafer W, it is difficult to remove the water droplets if the air ejection ports are too far from the front surface Wa of the wafer W. Further, when cleaning the holding surface of the second transfer pad 37 with the cleaning unit 8, if the holding surface of the second transfer pad 37 is too far from the cleaning brush section 84 (the brushes 85 and the stone 86), a contact force of the cleaning brush section 84 against the holding surface is insufficient. Conversely, if the holding surface of the second transfer pad 37 is too close to the cleaning brush section 84, the bristles of the brushes 85 are bent and the bristle tips of the brushes 85 are not in contact with the holding surface. In such cases, the holding surface may not be cleaned sufficiently.

To cope with such a problem, the grinding apparatus 1 enables an operator to perform fine adjustment of the positions of the second transfer pad 37 and the second transfer arm 38 of the unloading mechanism 36 by use of a control screen image displayed on the touch panel 40. Note that the second transfer pad 37 and the second transfer arm 38 of the unloading mechanism 36 are examples of a moving mechanism.

In the control screen image displayed on the touch panel 40, as illustrated in FIG. 3A, various kinds of information such as numerical values indicating a current position or the like of the second transfer arm 38 when the unloading mechanism 36 unloads the wafer W from the chuck table 30 and transfers the wafer W to the spin cleaning unit 26 are indicated in fields of [1] to [8] in an arm-related setting region AR.

For example, in the field of [1], there is indicated a time period for which the operator will wait until the second transfer arm 38 at a predetermined wait position turns and the second transfer pad 37 holds (receives) the wafer W on the chuck table 30. In the field of [2], there is indicated a time period for which the operator will wait until the second transfer arm 38 having received the wafer W turns and the second transfer pad 37 places the wafer W on the spinner table 27 (passes the wafer W to the spinner table 27).

In the fields of [3] and [4], there are indicated respective correction values for a height and a turning angle of the second transfer arm 38 at the time of holding the wafer W on the chuck table 30. In the field of [8], there is indicated whether or not a cleaning water is ejected when the unloading mechanism 36 receives the wafer W.

In addition, numerical values indicating a current position or the like of the second transfer pad 37 when the second transfer pad 37 is positioned above the cleaning unit 8 and the holding surface of the second transfer pad 37 is cleaned are indicated in fields of [10] to [15] in a pad cleaning setting region PR.

In the fields of [10] to [12] and [15], there are indicated a cleaning time period during which the cleaning unit 8 cleans the holding surface of the second transfer pad 37, a rotational speed of the cleaning brush section 84, a rotational direction of the cleaning brush section 84, and a cleaning interval, respectively. In the field of [13], there is indicated a speed of swing of the second transfer pad 37 along the Y-axis directions at the time of cleaning. In the field of [14], there is indicated a correction value for a height (a position in the Z-axis directions) of the holding surface of the second transfer pad 37 with respect to the cleaning brush section 84.

In the present embodiment, in a case in which the operator desires to correct the height of the second transfer pad 37 (the height of the holding surface thereof), a portion including the field of [14] on the touch panel 40 functions as a correction value setting area. In other words, in this case, the operator touches a display position of the field of [14] on the touch panel 40. A correction value inputting screen image 41 as illustrated in FIG. 3B is thereby displayed on the touch panel 40.

The second transfer pad 37 is configured so as to be moved by the second transfer arm 38 and the second elevating means 39 above the cleaning unit 8 along the Z-axis directions on a moving path (a path extending vertically) between a first position where the second transfer pad 37 is positioned the highest and a second position where the second transfer pad 37 is positioned the lowest. The first position and the second position are determined on the basis of a height of the cleaning brush section 84 of the cleaning unit 8, movable ranges of the second transfer arm 38 and the second elevating means 39, and the like.

The correction value inputting screen image 41 illustrated in FIG. 3B includes a display portion 43 and an input key group 45. The input key group 45 includes a numeric keypad for inputting an amount (a numerical value) of movement of the second transfer pad 37 on the moving path, and a vertical arrow key 47 for switching a direction of movement of the second transfer pad 37. On the vertical arrow key 47, "↑ (upward arrow)" and "↓ (downward arrow)" as marks (arrows) visually indicating the type of the moving direction are displayed.

"↑" indicates the upward direction, i.e., a direction from the current position of the second transfer pad 37 on the moving path toward the first position (the highest position). "↓" indicates the downward direction, i.e., a direction from the current position of the second transfer pad 37 on the moving path toward the second position (the lowest position).

By pressing the vertical arrow key 47, the operator can set the moving direction of the second transfer pad 37 to either the upward direction or the downward direction. The set moving direction is displayed in the display portion 43. Note that the upward direction and the downward direction are examples of a first direction and a second direction, respectively. "↑" and "↓" are examples of a first arrow and a second arrow, respectively.

The operator inputs the movement amount by using the numeric keypad. The input movement amount is also displayed in the display portion 43. Further, the moving direction and movement amount thus input are displayed in the field of [14] in the pad cleaning setting region PR. In the present embodiment, in the field of [14], the upward direction is indicated with a positive value and the downward direction is indicated with a negative value, for example. If the operator inputs "↓185" in order to move the second transfer pad 37 downward by 185 mm as illustrated in FIG. 3B, for example, "−185" is displayed in the field of [14] in the pad cleaning setting region PR.

In a case in which the operator judges that the input moving direction and movement amount are appropriate, the operator presses a save button S. In response to the pressing, a height position of the second transfer pad 37 is moved in accordance with the input moving direction and movement amount.

In contrast, in a case in which the operator judges that the input moving direction and movement amount are inappropriate, the operator presses a cancel button C. In response to the pressing, the numerical value indicated in the field of [14] or the like is deleted, and the operator does not perform correction, or resets the moving direction and the movement amount associated with the correction.

In addition, the operator desires to correct the horizontal position of the second transfer pad 37 in some cases. As described above, the second transfer pad 37 is configured so as to turn in an XY plane on a moving path (a turning path) between a position above the chuck table 30 (a first position) and a position above the spinner table 27 (a second position). The position of the second transfer pad 37 on the turning path is determined on the basis of the turning angle of the second transfer arm 38 having the second transfer pad 37 held at the distal end thereof.

In this case, a portion including the field of [4] illustrated in FIG. 3A on the touch panel 40 functions as the correction value setting area. In the field of [4], a correction value for the turning angle of the second transfer arm 38 having the second transfer pad 37 held at the distal end thereof with the second elevating means 39 as a turning axis is indicated.

Figure 4:
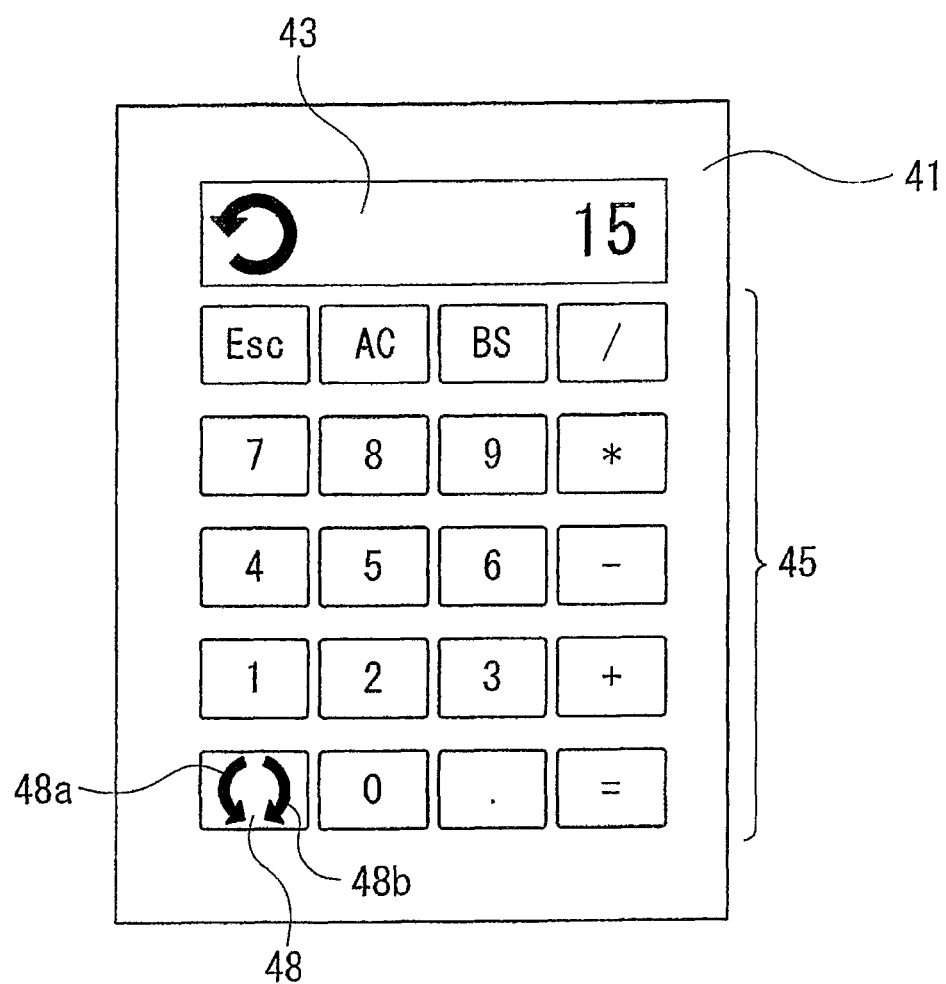
FIG. 4 is a schematic view illustrating another example of the correction value inputting screen image.

When the operator touches a display position of the field of [4] on the touch panel 40, a correction value inputting screen image 41 as illustrated in FIG. 4 is displayed on the touch panel 40. An input key group 45 in the correction value inputting screen image 41 is the same as the input key group 45 illustrated in FIG. 3B except that a rotational arrow key 48 is provided in place of the vertical arrow key 47. On the rotational arrow key 48, a leftward-rotating arrow 48a and a rightward-rotating arrow 48b as arrows visually indicating the type of a moving direction of the second transfer pad 37 are displayed.

The leftward-rotating arrow 48a indicates the counterclockwise direction, i.e., a direction from the current position of the second transfer pad 37 toward the second position that is the position above the spinner table 27. The rightward-rotating arrow 48b indicates the clockwise direction, i.e., a direction from the current position of the second transfer pad 37 on the moving path toward the first position above the chuck table 30.

By pressing the rotational arrow key 48, the operator can set the moving direction of the second transfer pad 37 to either the clockwise direction or the counterclockwise direction. The set moving direction is displayed in a display portion 43. Note that the clockwise direction and the counterclockwise direction are examples of the first direction and the second direction, respectively. The rightward-rotating arrow 48b and the leftward-rotating arrow 48a are examples of the first arrow and the second arrow, respectively.

Further, the operator inputs a movement amount by using a numeric keypad. The input movement amount is also displayed in the display portion 43. Further, the moving direction and the movement amount are displayed in the field of [4] in the arm-related setting region AR. In the present embodiment, in the field of [4], the clockwise direction is indicated with a positive value, and the counterclockwise direction is indicated with a negative value, for example. If the operator performs inputting so as to turn the second transfer pad 37 in the counterclockwise direction by 15° as illustrated in FIG. 4, for example, "−15" is displayed in the field of [4] in the arm-related setting region AR.

Note that the unloading mechanism 36 illustrated in FIG. 1 is configured to turn the second transfer arm 38 to move the second transfer pad 37. Alternatively, the unloading mechanism 36 may be configured such that the second transfer arm 38 linearly moves the second transfer pad 37 in the XY plane along the X-axis directions and the Y-axis directions on the moving path between the position above the chuck table 30 (the first position) and the position above the spinner table 27 (the second position). In this case, the distal end of the second transfer arm 38 linearly moves along the X-axis directions and the Y-axis directions with the second transfer pad 37 held thereon.

Following is a description of a case in which the position of the second transfer pad 37 on a moving path (a path extending leftward and rightward) along the X-axis directions is corrected. In this case, in the field of [4] in FIG. 3A, for example, there is indicated a correction value (the unit is millimeter, for example) for the position, in the X-axis directions, of the distal end of the second transfer arm 38 having the second transfer pad 37 held thereon. In a case in which the operator desires to correct the position of the second transfer pad 37 in the X-axis directions, for example, a portion including the field of [4] on the touch panel 40 functions as a correction value setting area. By the operator's touching the display position of the field of [4], a correction value inputting screen image 41 as illustrated in FIG. 5 is displayed on the touch panel 40.

Figure 5:
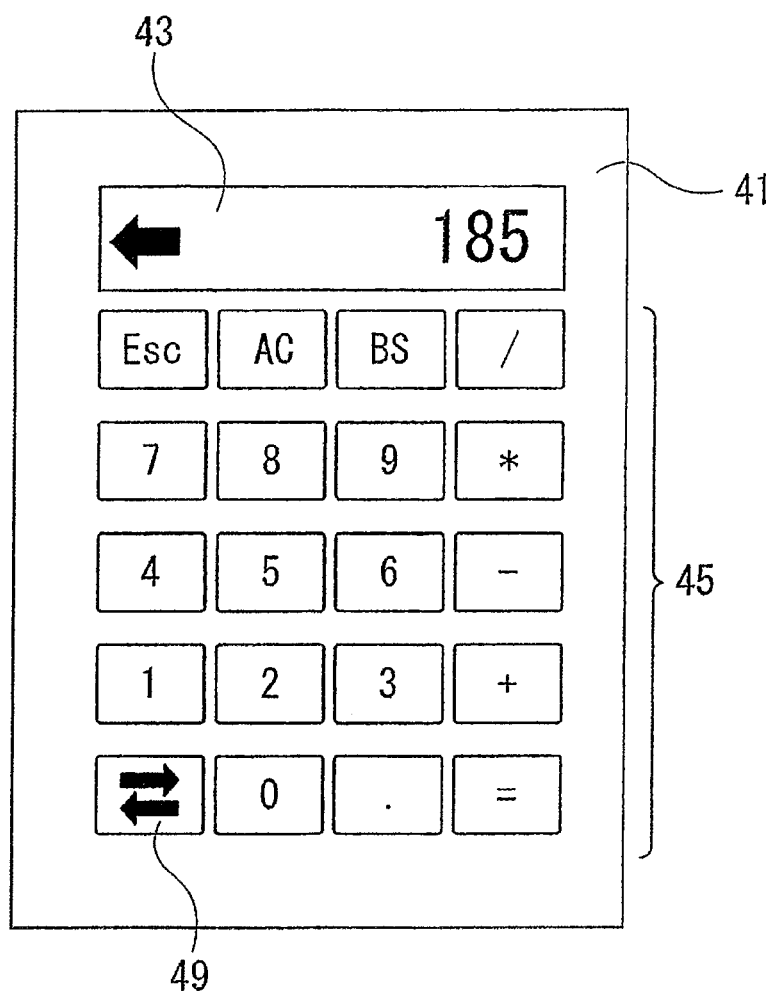
FIG. 5 is a schematic view illustrating a further example of the correction value inputting screen image.

An input key group 45 in the correction value inputting screen image 41 illustrated in FIG. 5 is the same as the input key group 45 illustrated in FIG. 3B except that a horizontal arrow key 49 is provided in place of the vertical arrow key 47. On the horizontal arrow key 49, "→ (rightward arrow)" and "← (leftward arrow)" as arrows visually indicating the type of a moving direction of the second transfer pad 37 are displayed.

"→" indicates the rightward direction, i.e., a direction (the +X-axis direction) approaching the chuck table 30 along the X axis from the current position of "←" the second transfer pad 37 on the moving path. "←" indicates the leftward direction, i.e., a direction (the −X-axis direction) approaching the spinner table 27 along the X axis from the current position of the second transfer pad 37 on the moving path.

By pressing the horizontal arrow key 49, the operator can set the moving direction of the second transfer pad 37 to either the +X-axis direction or the −X-axis direction. The set moving direction is displayed in a display portion 43. Note that the +X-axis direction and the −X-axis direction are examples of the first direction and the second direction, respectively. "→" and "←" are examples of the first arrow and the second arrow, respectively.

Further, the operator inputs a movement amount by using a numeric keypad. The input movement amount is also displayed in the display portion 43. Further, the moving direction and the movement amount of the second transfer pad 37 are displayed in the field of [4] in the arm-related setting region AR as a moving direction and a movement amount of the distal end of the second transfer arm 38. In the field of [4], the +X-axis direction is indicated with a positive value, and the −X-axis direction is indicated with a negative value, for example. If the operator inputs "←185" in order to move the second transfer pad 37 in the −X-axis direction by 185 mm as illustrated in FIG. 5, for example, "−185" is displayed in the field of [4] in the arm-related setting region AR.

Note that, also in the case of correcting the position of the second transfer pad 37 (the distal end of the second transfer arm 38) on a moving path (a path extending forward and backward) along the Y-axis directions, a moving direction and a movement amount in association with the correction are set in a manner similar to that described with reference to FIG. 5.

As described above, in the grinding apparatus 1, the second transfer pad 37 is positioned on the moving path between the first position (the highest position or the position above the chuck table 30) to the second position (the lowest position or the position above the spinner table 27). Then, the operator uses the touch panel 40 to correct the position of the second transfer pad 37 on the moving path. In this case, the operator inputs the moving direction and the movement amount in association with the correction of the position through any of the correction value inputting screen images 41 as illustrated in FIG. 3B, FIG. 4, and FIG. 5. The moving direction is either the first direction toward the first position on the moving path or the second direction toward the second position on the moving path.

With the touch panel 40, in particular, the operator can set the moving direction by using the arrow keys 47 to 49. The moving direction set by the operator is then displayed as an arrow in the display portion 43.

This enables the operator to set the moving direction in association with the correction while visually recognizing the contents of the setting, so that the operator can set the moving direction with less hesitation. Therefore, it is possible to suppress erroneous setting of the moving direction and to shorten the time required for the setting of the correction.

In addition, examples of the moving path of the moving mechanism include the path extending vertically, the path extending forward and backward, the path extending leftward and rightward, and the turning path.

Further, on the arrow keys 47 to 49, the first arrow indicating the first direction on the moving path and the second arrow indicating the second direction on the moving path are displayed. In other words, the arrows visually indicating the type of the moving direction are displayed on the arrow keys 47 to 49. Accordingly, the operator can set the moving direction with further less hesitation.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A touch panel provided in a processing apparatus and receiving inputs of a moving direction and a movement amount of a moving mechanism positioned on a moving path between a first position and a second position, wherein the moving mechanism includes a transfer arm and is configured and arranged to move a workpiece, wherein the touch panel comprises:
   a numeric keypad for inputting the movement amount of the moving mechanism; and
   an arrow key for setting the moving direction of the moving mechanism to one of a first direction toward the first position on the moving path and a second direction toward the second position on the moving path,
   wherein the moving path includes a path extending vertically, such that pressing the arrow key moves the workpiece vertically closer or vertically farther away from a rotating cleaning unit.

2. The touch panel according to claim 1, wherein the moving path also includes a path extending forward and backward, a path extending leftward and rightward, and a turning path.

3. The touch panel according to claim 2, wherein a first arrow indicating the first direction on the moving path and a second arrow indicating the second direction on the moving path are displayed on the arrow key.

4. The touch panel according to claim 1, wherein the moving path includes a path extending forward and backward, such that pressing the arrow key moves the workpiece in a forward direction or a backward direction.

5. The touch panel according to claim 1, wherein the moving path includes a path extending leftward and rightward, such that pressing the arrow key moves the workpiece in a leftward direction or a rightward direction.

6. The touch panel according to claim 1, wherein the moving path includes a turning path, such that pressing the arrow key rotates the transfer arm about a turning axis.

7. The touch panel according to claim 1,
   wherein the moving mechanism includes a transfer pad that is configured and arranged for holding the workpiece under suction.

8. The touch panel according to claim 7, wherein the moving mechanism is configured and arranged to move the transfer pad into contact with a rotating cleaning unit.

9. The touch panel according to claim 8, wherein the rotating cleaning unit includes a stone portion and a brush portion.

10. The touch panel according to claim 9, wherein:
    the stone portion is formed in a parallelepiped shape; and
    the brush portion perpendicularly intersects the stone portion.

11. The touch panel according to claim 7, wherein the moving path includes a path extending forward and backward, such that pressing the arrow key moves the workpiece in a forward direction or a backward direction.

12. The touch panel according to claim 7, wherein the moving path includes a path extending leftward and rightward, such that pressing the arrow key moves the workpiece in a leftward direction or a rightward direction.

13. The touch panel according to claim 7, wherein the moving path includes a turning path, such that pressing the arrow key rotates the transfer arm about a turning axis.

14. A touch panel provided in a processing apparatus and receiving inputs of a moving direction and a movement amount of a moving mechanism positioned on a moving path between a first position and a second position, wherein the moving mechanism includes a transfer arm and is configured and arranged to move a workpiece, wherein the touch panel comprises:

a numeric keypad for inputting the movement amount of the moving mechanism; and an arrow key for setting the moving direction of the moving mechanism to one of a first direction toward the first position on the moving path and a second direction toward the second position on the moving path, wherein the moving mechanism is configured and arranged to move the workpiece into contact with a rotating cleaning unit.

15. The touch panel according to claim 14, wherein the rotating cleaning unit includes a stone portion and a brush portion.

16. The touch panel according to claim 15, wherein:
the stone portion is formed in a parallelepiped shape; and
the brush portion perpendicularly intersects the stone portion.

17. The touch panel according to claim 14, wherein the moving path includes a path extending forward and backward, such that pressing the arrow key moves the workpiece in a forward direction or a backward direction.

18. The touch panel according to claim 14, wherein the moving path includes a path extending leftward and rightward, such that pressing the arrow key moves the workpiece in a leftward direction or a rightward direction.

19. The touch panel according to claim 14, wherein the moving path includes a turning path, such that pressing the arrow key rotates the transfer arm about a turning axis.

* * * * *